US009608406B1

(12) United States Patent
Lee et al.

(10) Patent No.: US 9,608,406 B1
(45) Date of Patent: Mar. 28, 2017

(54) WAVELENGTH CONTROL OF A DUAL-RING LASER

(71) Applicant: Oracle International Corporation, Redwood Shores, CA (US)

(72) Inventors: Jin-Hyoung Lee, San Diego, CA (US); Xuezhe Zheng, San Diego, CA (US); Ashok V. Krishnamoorthy, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 0 days.

(21) Appl. No.: 15/004,569

(22) Filed: Jan. 22, 2016

(51) Int. Cl.
*H01S 3/10* (2006.01)
*H01S 5/06* (2006.01)
*H01S 5/10* (2006.01)
*H01S 5/30* (2006.01)
*H01S 5/026* (2006.01)

(52) U.S. Cl.
CPC .......... *H01S 5/0612* (2013.01); *H01S 5/026* (2013.01); *H01S 5/1071* (2013.01); *H01S 5/3013* (2013.01)

(58) Field of Classification Search
CPC ....... H01S 5/026; H01S 5/1071; H01S 5/3013

USPC ........................................................ 359/344
See application file for complete search history.

(56) References Cited

U.S. PATENT DOCUMENTS 7,539,369 B2 * 5/2009 Yamazaki .......... G02B 6/12007
                                                   333/219
7,565,045 B2 * 7/2009 Suzuki .................... H01S 5/141
                                                   359/326

* cited by examiner

*Primary Examiner* — Tuan Nguyen
(74) *Attorney, Agent, or Firm* — Park, Vaughan, Fleming & Dowler LLP

(57) ABSTRACT

An optical source includes a semiconductor optical amplifier that provides an optical signal, and a photonic chip with first and second ring resonators that operate as Vernier rings. When the optical source is operated below a lasing threshold, one or more thermal-tuning mechanisms, which may be thermally coupled to the first ring resonator and/or the second ring resonator, may be adjusted to align resonances of the first ring resonator and the second ring resonator based on measured optical power on a shared optical waveguide that is optically coupled to the first and second ring resonators. Then, when the optical source is operated above the lasing threshold, a common thermal-tuning mechanism may be adjusted to lock the aligned resonances with an optical cavity mode of the optical source based on a measured optical power on an optical waveguide that is optically coupled to the first ring resonator.

20 Claims, 13 Drawing Sheets

WAVELENGTH CONTROL OF A DUAL-RING LASER

GOVERNMENT LICENSE RIGHTS

This invention was made with U.S. government support under Agreement No. HR0011-08-9-0001 awarded by DARPA. The U.S. government has certain rights in the invention.

BACKGROUND

Field

The present disclosure relates to a technique for operating an optical source. More specifically, the present disclosure relates to a technique for tuning an external cavity laser.

Related Art

A hybrid III-V semiconductor-silicon laser is being investigated as a silicon-photonics light source. By fully utilizing the mature technology of III-V semiconductors and silicon-photonics independently, a most efficient and manufacturable light source can be realized using a silicon-photonics platform. In particular, a silicon-on-insulator (SOI) platform can provide wavelength selectivity and a semiconductor chip can provide optical gain.

Moreover, laser-wavelength tunability is becoming an important capability for a light source in optical communications. This is particularly the case in wavelength-division-multiplexing (WDM) applications in which the optical signals include multiple wavelengths. Therefore, in these applications a tunable laser source may provide flexibility and may eliminate the need for multiple single-wavelength lasers. Laser tunability is also important in allowing the laser wavelength to be matched to other components, such as a resonator-based modulator.

In a hybrid laser configuration, the laser-wavelength control circuit is typically implemented on the SOI chip. Moreover, because of their resonant nature (Lorentz-type line shape) and efficient wavelength-tuning mechanism (such as the thermo-optic effect and/or the free carrier dispersion), micro-ring resonators can provide excellent wavelength selectivity. For example, a micro-ring resonator in conjunction with a 1×2 splitter (or Y-junction) can form a loop-type reflector that feeds the resonance wavelength of the micro-ring resonator back to the optical cavity. Note that the optical bandwidth of the feedback signals is determined by the quality factor (Q factor) of the micro-ring resonator and can be controllable by adjusting the coupling coefficient of the micro-ring resonator.

While a single ring-resonator reflector typically provides excellent single-wavelength feedback, the tuning range is usually limited to one free-spectral range or FSR (e.g., a ring resonator with a 5 μm radius provides an FSR of approximately 20 nm). Consequently, in order to have a wide tuning range, the ring resonator typically needs to have a very small radius. For example, in order to have a tuning range of 40 nm, a single ring resonator typically has a radius less than 3 μm. However, the bending loss of a ring resonator increases significantly in this small bending-radius regime, and typical heaters (such as a metal heater or a silicon heater) become inefficient because of the short length. Furthermore, because the Q factor of the ring resonator is reduced (and, thus, the feedback filter is broadened), multiple optical cavity modes can lase within the ring resonance, which can adversely affect laser stability and can result in mode-hopping.

In principle, these issues can be addressed using a Vernier dual ring-resonator reflector. In particular, two micro-ring resonators with slightly different radii can provide an extended wavelength tuning range via the Vernier effect. For example, a 45 nm tuning range (i.e., FSR) may be obtained using ring resonators with radii of 7.5 μm and 10 μm. This wide FSR may facilitate stable and single-mode laser operation.

However, in practice, a Vernier dual ring-resonator reflector often poses additional challenges. For example, one of the challenges with a Vernier dual ring-resonator reflector is wavelength control, because it requires precise control of two independent ring resonators so that they remain aligned with each other, and so that only one reflection wavelength can pass through in the entire laser cavity. In particular, this requirement typically requires that the resonance band of each ring resonator be examined in advance, aligned with each other and confirmed in a spectral domain. This approach is usually expensive and slow, which can make a Vernier dual ring-resonator reflector less attractive.

Hence, what is needed is an optical source without the above-described problems.

SUMMARY

One embodiment of the present disclosure provides an optical source that includes a semiconductor optical amplifier defined in a semiconductor other than silicon and having a first edge and a second edge. This semiconductor optical amplifier includes a reflective coating on the first edge, and the semiconductor optical amplifier may provide an optical signal at the second edge. Moreover, the optical source includes a photonic chip optically coupled to the semiconductor optical amplifier. This photonic chip includes: a first optical waveguide having a third edge, optically coupled to the second edge of the semiconductor optical amplifier, and a fourth edge; an output optical waveguide, optically coupled to the first optical waveguide between the third edge and the fourth edge, that outputs the optical signal having a carrier wavelength; and a first ring resonator optically coupled to the first optical waveguide.

Moreover, the photonic chip includes: a second optical waveguide, optically coupled to the first ring resonator, having a fifth edge and a sixth edge optically coupled to a first termination; a second ring resonator optically coupled to the second optical waveguide; and a third optical waveguide, optically coupled to the second ring resonator, having a seventh edge optically coupled to a reflector and an eighth edge optically coupled to a second termination. Furthermore, the photonic chip includes: a common thermal-tuning mechanism thermally coupled to the first ring resonator and the second ring resonator; a first thermal-tuning mechanism thermally coupled to the first ring resonator; and a second thermal-tuning mechanism thermally coupled to the second ring resonator; a monitoring device optically coupled to the fourth edge and the fifth edge; and control logic, electrically coupled to the monitoring device, the common thermal-tuning mechanism, the first thermal-tuning mechanism and the second thermal-tuning mechanism.

The control logic tunes the first ring resonator and the second ring resonator by: adjusting, when the optical source is operated below a lasing threshold, the first and/or the second thermal-tuning mechanism to align a first resonance of the first ring resonator with a second resonance of the second ring resonator within the lasing-wavelength band based on a measured optical power at the fifth edge; and adjusting, when the optical source is operated above the lasing threshold, the common thermal-tuning mechanism to lock the aligned first and second resonances with an optical cavity mode of the optical source based on a measured optical power at the fourth edge.

Note that the first and the second resonances may be aligned by minimizing the measured optical power at the fifth edge.

Moreover, the first and the second resonances may be aligned by minimizing the measured optical power at the fourth edge.

Furthermore, the semiconductor optical amplifier may be: edge coupled to the photonic chip; and/or surface-normal coupled to the photonic chip.

Additionally, a given thermal-tuning mechanism may include: a doped semiconductor heater; and/or a metal heater.

In some embodiments, the optical source includes a phase modulator optically coupled to the first optical waveguide.

Moreover, the photonic chip may include: a substrate; a buried-oxide layer disposed on the substrate; and a semiconductor layer disposed on the buried-oxide layer, where optical components are defined in the semiconductor layer. For example, the substrate, the buried-oxide layer and the semiconductor layer may constitute a silicon-on-insulator technology.

Furthermore, the control logic may maintain the alignment of the first and the second resonances with the optical cavity mode by: adjusting the common thermal-tuning mechanism to minimize the measured output power at the fourth edge; and adjusting the first and/or the second thermal-tuning mechanisms to minimize the measured output power at the fifth edge.

Another embodiment provides a system that includes: a processor, memory, and the optical source.

Another embodiment provides a method for tuning an optical source that includes a first ring resonator and a second ring resonator that operate as Vernier rings.

This Summary is provided merely for purposes of illustrating some exemplary embodiments, so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of an optical source (such as a hybrid external cavity laser), a system that includes the optical source, and a technique for tuning the optical source are described. The optical source includes a semiconductor optical amplifier that provides an optical signal, and a photonic chip with first and second ring resonators that operate as Vernier rings. When the optical source is operated below a lasing threshold, a thermal-tuning mechanism, which is thermally coupled to the first and/or the second ring resonators, may be adjusted to align a first resonance of the first ring resonator and a second resonance of the second ring resonator based on measured optical power on a shared optical waveguide that is optically coupled to the first and second ring resonators. Then, when the optical source is operated above the lasing threshold, a common thermal-tuning mechanism may adjust the lock the aligned first and second resonances of the first and the second ring resonators with an optical cavity mode of the optical source based on a measured optical power on an optical waveguide that is optically coupled to the first ring resonator.

By facilitating tuning and subsequent control of the carrier wavelength of the optical source, this feedback-control technique may allow real-time optical power monitoring and feedback-loop control of the first and the second ring resonators to simultaneously align them with an optical cavity mode. This feedback-control technique may provide laser-mode stabilization during laser operation. In particular, by facilitating the use of the Vernier rings to reduce the effective filter width, the feedback-control technique may promote selection of a single optical cavity mode for lasing, thereby improving laser stability. In addition, the feedback-control technique may provide simple and fast wavelength tuning. Consequently, the feedback-control technique may reduce the complexity and cost of the optical source, while improving its performance.

Therefore, the feedback-control technique may allow the optical source to be used as a low-cost, compact, energy-efficient optical source in inter-chip and intra-chip connections, such as wavelength-division-multiplexing (WDM) silicon-photonic links. Furthermore, the optical source may help facilitate high-speed inter- and intra-chip silicon-photonic interconnects, as well as associated systems that can include this component (such as high-performance computing systems).

Figure 1:
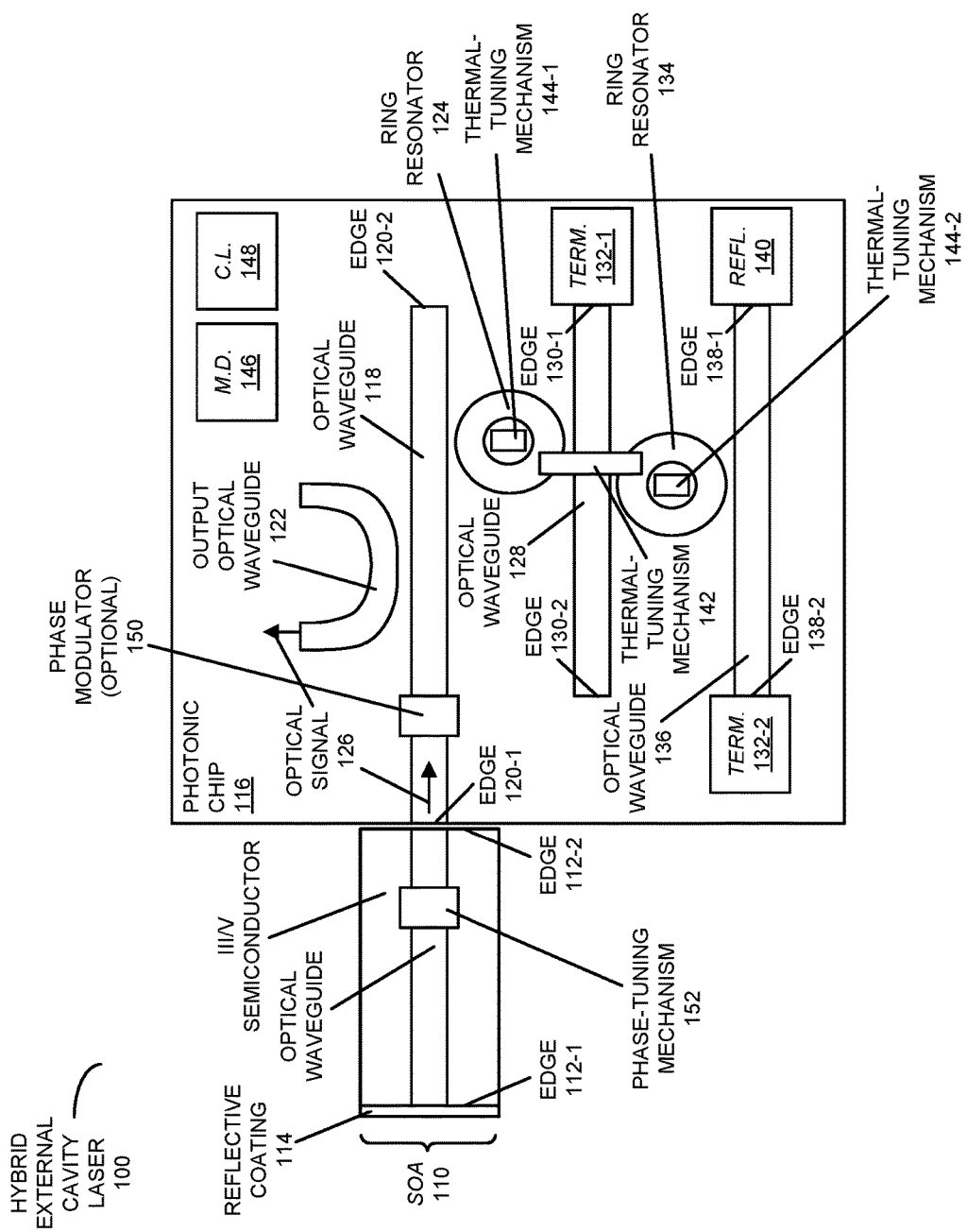
FIG. 1 is a block diagram of a hybrid external cavity laser in accordance with an embodiment of the present disclosure.

We now describe embodiments of the optical source, such as a hybrid external cavity laser (which is used as an illustration). FIG. 1 presents a block diagram of a hybrid external cavity laser 100. This hybrid external cavity laser includes: a semiconductor optical amplifier (SOA) 110 defined in a semiconductor other than silicon (such as a compound semiconductor or a semiconductor having a direct bandgap, e.g., gallium-arsenide, indium-phosphide, erbium or germanium) having edges 112. This semiconductor optical amplifier includes a reflective coating (or layer) 114 (such as a mirror) on edge 112-1 (therefore, semiconductor optical amplifier 110 may be a reflective semiconductor optical amplifier), and semiconductor optical amplifier 110 may provide an optical signal 126 at edge 112-2.

Moreover, hybrid external cavity laser 100 includes a photonic chip 116 optically coupled to semiconductor optical amplifier 110. For example, semiconductor optical amplifier 110 may be: edge coupled to photonic chip 116 (such as facet-to-facet optical coupling); and/or surface-normal coupled to photonic chip 116. In particular, the edge-to-edge coupling may be facilitated by using a wide optical waveguide in semiconductor optical amplifier 110 (such as an optical waveguide having a width of 2-3 µm), and optical waveguide 118 in photonic chip 116 may have a width of several hundred nanometers. Alternatively, semiconductor optical amplifier 110 may be flip-chip bonded onto photonic chip 116, and the surface-normal coupling may involve etched or angled mirrors, grating couplers (such as a diffraction grating) and/or optical proximity communication (such as using reflective mirrors and/or evanescent coupling).

Photonic chip 116 includes: an optical waveguide 118, having edges 120, that conveys optical signal 126; an output optical waveguide 122, optically coupled to optical waveguide 118 between edges 120 (e.g., by a directional coupler), that outputs optical signal 126 having a carrier wavelength (however, optical signal 126 may be extracted from hybrid external cavity laser 100 in a variety of ways, such as direct output from a partially reflective mirror); and a ring resonator 124 (and, more generally, a wavelength-selective filter or reflector), optically coupled to optical waveguide 118 and having a resonance wavelength, which reflects at least the resonance wavelength in optical signal 126.

Furthermore, photonic chip 116 may include: an optical waveguide 128, having edges 130, optically coupled to ring resonator 124, where edge 130-1 is optically coupled to a termination (TERM.) 132-1; a ring resonator 134 optically coupled to optical waveguide 128; and an optical waveguide 136, having edges 138, optically coupled to ring resonator 134, where edge 138-1 is optically coupled to a reflector (REFL.) 140 (such as a loop mirror) and edge 138-2 is optically coupled to termination 132-2. Note that reflective coating 114 and ring resonators 124 and 134 may define an optical cavity.

Additionally, photonic chip 116 may include: a common thermal-tuning mechanism 142 thermally coupled to ring resonators 124 and 134; a thermal-tuning mechanism 144-1 thermally coupled to ring resonator 124; a thermal-tuning mechanism 144-2 thermally coupled to ring resonator 134; one or more monitoring devices (M.D.s) 146 (such as a photodetector and/or an optical interferometer) optically coupled to edges 120-2 and 130-2; and control logic (C.L.) 148 (which may implement electrical circuits), electrically coupled to monitoring device 146, the common thermal-tuning mechanism 142, thermal-tuning mechanism 144-1, and thermal-tuning mechanism 144-2. Note that a given thermal-tuning mechanism may include: a doped semiconductor heater; and/or a metal heater.

As described further below with reference to FIGS. 2-9, control logic 148 may tune ring resonators 124 and 134 by: adjusting, when hybrid external cavity laser 100 is operated below a lasing threshold, thermal-tuning mechanism 144-1 to align resonances of ring resonators 124 and 134 by adjusting a temperature of ring resonators 124 and/or 134 based on a measured optical power at edge 130-2; and adjusting, when hybrid external cavity laser 100 is operated above the lasing threshold, the common thermal-tuning mechanism 142 to lock the aligned resonances of ring resonators 124 and 134 with an optical cavity mode of hybrid external cavity laser 100 having the carrier wavelength by adjusting a temperature of ring resonators 124 and/or 134 based on a measured optical power at edge 120-2.

Note that the resonances of ring resonators 124 and 134 may be aligned by minimizing the measured optical power at edge 130-2.

Moreover, control logic 148 may maintain the alignment of the aligned resonances with the optical cavity mode by: adjusting common thermal-tuning mechanism 142 to minimize the measured output power at edge 120-2; and adjusting thermal-tuning mechanisms 144-1 and/or 144-2 to minimize the measured output power at edge 130-2.

In some embodiments, hybrid external cavity laser 100 includes an optional phase modulator 150 (such as a heater or by using electrical carrier injection) optically coupled to optical waveguide 118. While in some embodiments the phase tuning is performed in semiconductor optical amplifier 110 (e.g., by phase-tuning mechanism 152), it may be advantageous to perform the phase tuning in photonic chip 116 because the phase tuning can be done thermally (e.g. by heating optical waveguide 118 using a heater or a resistor) without causing additional free-carrier absorption loss (which often results when electrical carrier injection is used to tune phase).

Furthermore, photonic chip 116 may include: a substrate; a buried-oxide layer disposed on the substrate; and a semiconductor layer disposed on the buried-oxide layer, where optical components are defined in the semiconductor layer. For example, the substrate, the buried-oxide layer and the semiconductor layer may constitute a silicon-on-insulator technology.

In an exemplary embodiment, the fundamental or the carrier wavelength of optical signal 126 is between 1.1-1.7 For example, optical signal 126 may have a fundamental or a carrier wavelength of 1.3 or 1.55 Moreover, the semiconductor layer may have a thickness that is less than 1 µm (such as 0.2-0.5 µm). For example, the semiconductor layer may have a thickness of 0.3 Furthermore, the buried-oxide layer may have a thickness between 0.3 and 3 µm (such as 0.8 µm). Moreover, a radius of a given ring resonator in ring resonators 124 and 134 may be between 5-30 µm.

Note that control logic 148 may be integrated with hybrid external cavity laser 100 either monolithically on photonic chip 116 or heterogeneously using flip-chip bonding to a VLSI circuit. Using the feedback-control technique, the laser operation can be actively stabilized so that the lasing cavity mode is locked to the resonance wavelengths of ring resonators 124 and 134, which allows the lasing cavity mode and the resonance wavelengths to be continuously synchronized and to drift together regardless of external influences. Because the feedback system monitors the optical power intensity in real-time (or with a sufficient sampling rate), the control-system design and monitoring configuration may be simplified.

In some embodiments, a given ring resonator is a very narrowband ring-resonator filter with resonance having a full width at half maximum (FMHW) that is less than the optical-mode spacing associated with the (hybrid) optical cavity. This may ensure that only a few cavity modes (or, preferably, only one cavity mode) may exist within the passband of the ring-resonator filter. For example, ring resonator 124 or 134 may have a radius of 5 μm, and an FSR of about 20 nm. Consequently, a ring-resonator filter with a high quality factor may be used as the tuning mirror. Alternatively or additionally, other tunable mirror structures may be used.

In an exemplary embodiment, because of the dual ring-resonator configuration in the Vernier reflector, the laser-wavelength control may be more complicated than the single ring-resonator case. The resonant wavelengths from both of the ring resonators may be aligned with each other in order to achieve optimum laser operation; otherwise, the laser performance may be adversely affected by a significant optical cavity round-trip loss. In order to align the two ring resonators, the ring-resonance responses of the two ring resonators may need to be measured separately and then aligned. However, existing alignment approaches are often very slow and usually require expensive optical components to analyze the optical spectrum.

In the disclosed hybrid external cavity laser 100, a feedback-control technique may be used to control the Vernier dual ring resonators in the laser reflector so that the laser wavelength can be controlled in a low-cost and simple manner. In particular, in FIG. 1, a Vernier dual ring-resonator structure is incorporated as a wavelength-selective component in hybrid external cavity laser 100. Moreover, using common thermal-tuning mechanism 142, thermal-tuning mechanism 144-1 and/or thermal-tuning mechanism 144-2 (which can be operated independently of each other), the carrier wavelength output from hybrid external cavity laser 100 can be tuned by applying feedback to heaters that are thermally coupled to ring resonators 124 and/or 134 based on measured optical power at through ports in hybrid external cavity laser 100.

The feedback-control technique for operation of the Vernier-ring reflector and the hybrid external cavity laser may include two main operations, including dual ring-resonator alignment and laser-cavity mode alignment.

Figure 2:
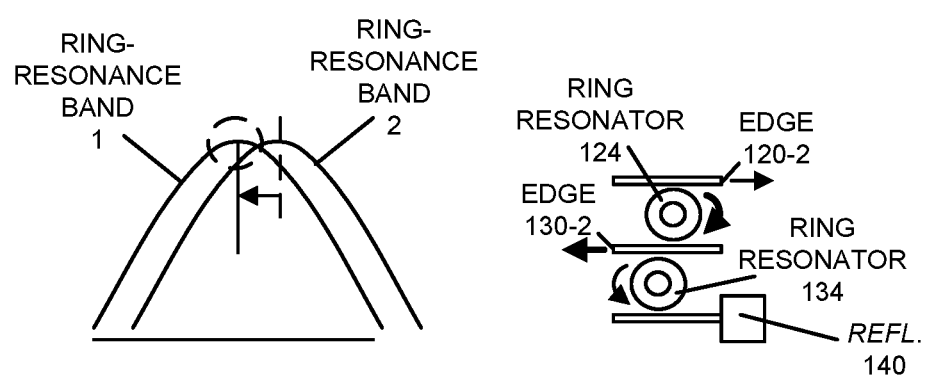
FIG. 2 is a drawing illustrating dual ring-resonator alignment in the hybrid external cavity laser of FIG. 1 in accordance with an embodiment of the present disclosure.

During the dual ring-resonator alignment, a fixed under-threshold bias current is applied on the optical gain chip to make sure it provides optical signal into the optical cavity but does not induce lasing. In the beginning, the two ring-resonance bands may not necessarily be in line with each other. This is shown in FIG. 2, which presents a drawing illustrating dual ring-resonator alignment in hybrid external cavity laser 100 (FIG. 1). In this case, more light may be passed through to edge 130-2, and less light may be optically coupled into ring resonator 134.

Figure 3:
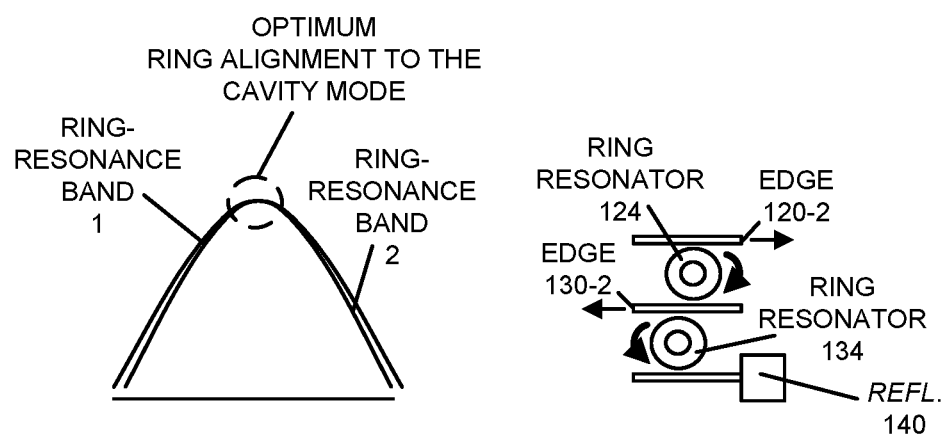
FIG. 3 is a drawing illustrating dual ring-resonator alignment in the hybrid external cavity laser of FIG. 1 in accordance with an embodiment of the present disclosure.

Then, the resonance wavelength of ring resonator 134 is moved by control logic 148 (FIG. 1) using thermal-tuning mechanisms 144-1 and/or 144-2 (FIG. 1) in order to minimize the optical power at edge 130-2. This may align the resonance wavelengths of ring resonators 124 and 134. Once control logic 148 (FIG. 1) settles into a constant condition, the transmission peaks of ring resonators 124 and 134 may be aligned and synchronized. This is shown in FIG. 3, which presents a drawing illustrating dual ring-resonator alignment in hybrid external cavity laser 100 (FIG. 1).

Figure 4:
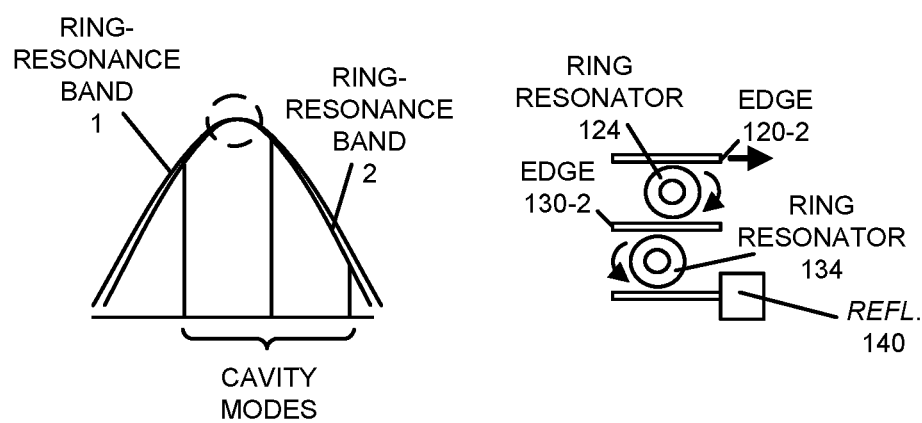
FIG. 4 is a drawing illustrating laser-cavity-mode alignment to dual ring-resonance bands in the hybrid external cavity laser of FIG. 1 in accordance with an embodiment of the present disclosure.
Figure 5:
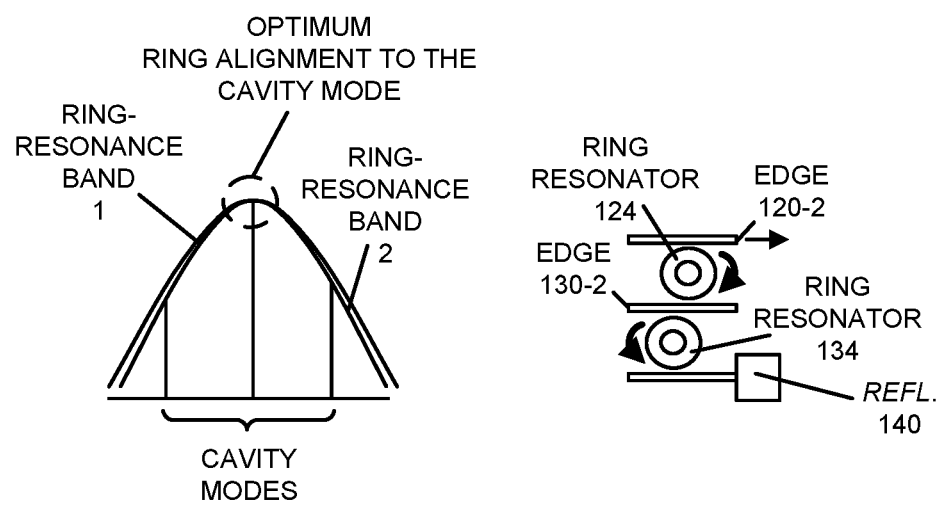
FIG. 5 is a drawing illustrating laser-cavity-mode alignment to dual ring-resonance bands in the hybrid external cavity laser of FIG. 1 in accordance with an embodiment of the present disclosure.

Next, the resonance wavelength of the ring resonators is aligned with the laser-cavity mode. In particular, once the dual ring resonators are aligned, a target operating bias current is applied to the optical gain chip so that lasing begins. For optimum laser operation, the laser still needs to align the dual ring-resonator resonance wavelength to the laser cavity mode. This is shown in FIG. 4, which presents a drawing illustrating laser-cavity-mode alignment to dual ring-resonance bands in hybrid external cavity laser 100 (FIG. 1). In order to accomplish this, control logic 148 (FIG. 1) may move the dual ring-resonator resonance wavelengths simultaneously using common thermal-tuning mechanism 142 (FIG. 1) while monitoring the optical power at edge 120-2. As shown in FIG. 5, which presents a drawing illustrating laser-cavity-mode alignment to dual ring-resonance bands in hybrid external cavity laser 100 (FIG. 1), control logic 148 (FIG. 1) may adjust the tuning power to common thermal-tuning mechanism 142 (FIG. 1) in order to minimize the optical power at edge 120-2. Then, control logic 148 (FIG. 1) may lock-in the tuning condition by the feedback loop. After the tuning condition is stabilized, the laser may operate at the optimum condition (i.e., the lowest optical cavity loss).

A variation on this feedback-control technique may be used to stabilize a Vernier dual-ring laser operation, so that there are fewer mode hops. In case of sudden, large, and non-continuous changes in ring resonance position (e.g. at start-up or power cycling), then the aforementioned procedure may be repeated to re-establish lasing at the preferred mode. However, it is possible to control the laser in the presence of environmental and temperature drifts using control logic 148 (FIG. 1) using a monitoring and feedback technique described in "External Cavity Laser with Reduced Optical Mode Hopping," by Ashok V. Krishnamoorthy, Jin-Hyoung Lee and Xuezhe Zheng, having U.S. patent application Ser. No. 14/714,078, and filed on May 15, 2015, the contents of which are hereby incorporated by reference.

In particular, if the resonance wavelength of a ring-resonator reflector is controlled so as to minimize the power at a monitoring port, then lasing may occur in a pre-selected optical cavity mode. In the discussion that follows, a variation on this monitoring and feedback technique is used with the Vernier dual ring-resonator reflector. In the Vernier dual ring-resonator case, the stability of the laser is affected by both the walk-off of the laser cavity mode from the common dual-ring resonance wavelength and the offset between two ring resonators. Therefore, both cavity mode drift and the resonance-wavelength offset of the two ring resonators may need to be monitored concurrently.

Figure 6:
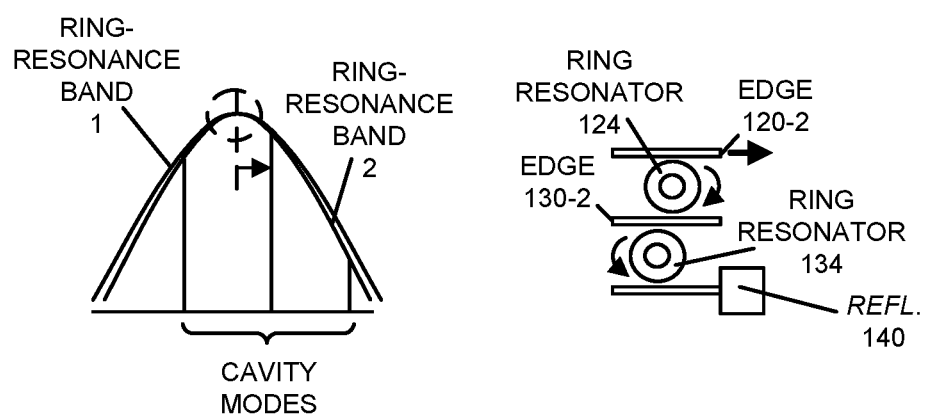
FIG. 6 is a drawing illustrating laser-cavity-mode alignment to dual ring-resonance bands in the hybrid external cavity laser of FIG. 1 in accordance with an embodiment of the present disclosure.
Figure 7:
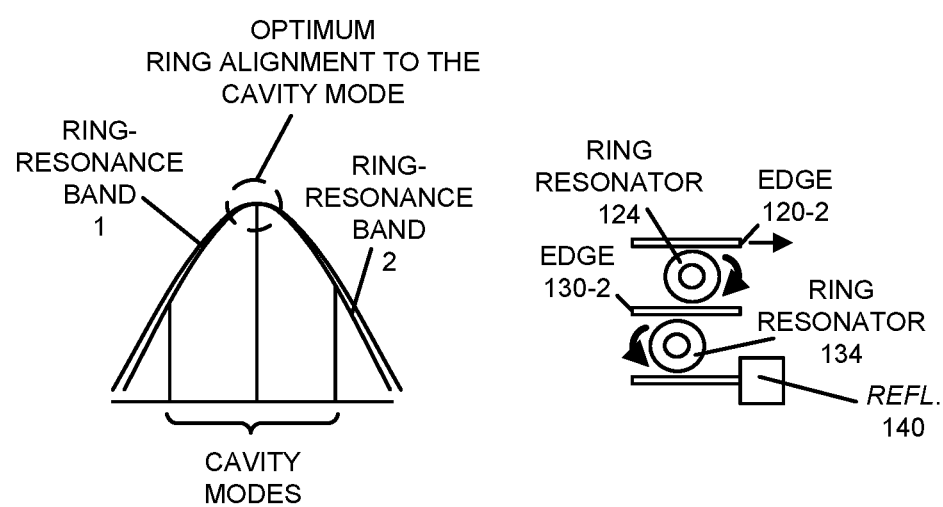
FIG. 7 is a drawing illustrating laser-cavity-mode alignment to dual ring-resonance bands in the hybrid external cavity laser of FIG. 1 in accordance with an embodiment of the present disclosure.

Control of the alignment of ring resonance wavelengths with the laser cavity mode during operation of the laser is shown in FIG. 6, which presents a drawing illustrating laser-cavity-mode alignment to dual ring-resonance bands in hybrid external cavity laser 100 (FIG. 1). In particular, ring-resonance transmission bands 1 and 2 for the two ring resonators may be aligned, but the laser cavity mode can be off from the ring-resonance peak because of an external environmental change. Lasing may still occur at the optical cavity mode that is closest to the ring-reflection peak (as illustrated by the circle), but a significant amount of optical power may be lost through the monitoring port; therefore, less optical power may remain inside the optical cavity. Consequently, the dual ring-resonator resonance needs to be moved to the optical cavity mode location. This can be accomplished by the feedback control loop implemented by control logic 148 (FIG. 1) to shift the dual ring-resonator resonance wavelength using common thermal-tuning mechanism 142 (FIG. 1) in order to minimize the optical power at edge 120-2. This is shown in FIG. 7, which presents a drawing illustrating laser-cavity-mode alignment to dual ring-resonance bands in hybrid external cavity laser 100 (FIG. 1). The laser should be in a stable condition once the tuning condition is locked-in.

Figure 8:
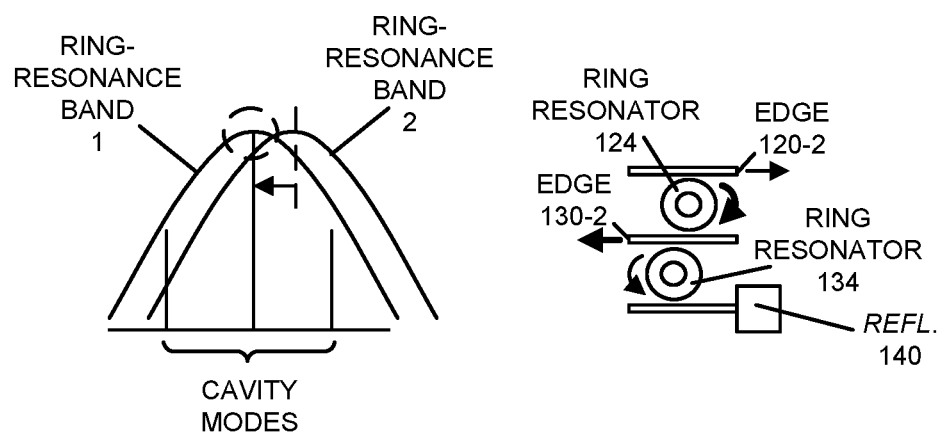
FIG. 8 is a drawing illustrating dual ring-resonator alignment during lasing in the hybrid external cavity laser of FIG. 1 in accordance with an embodiment of the present disclosure.
Figure 9:
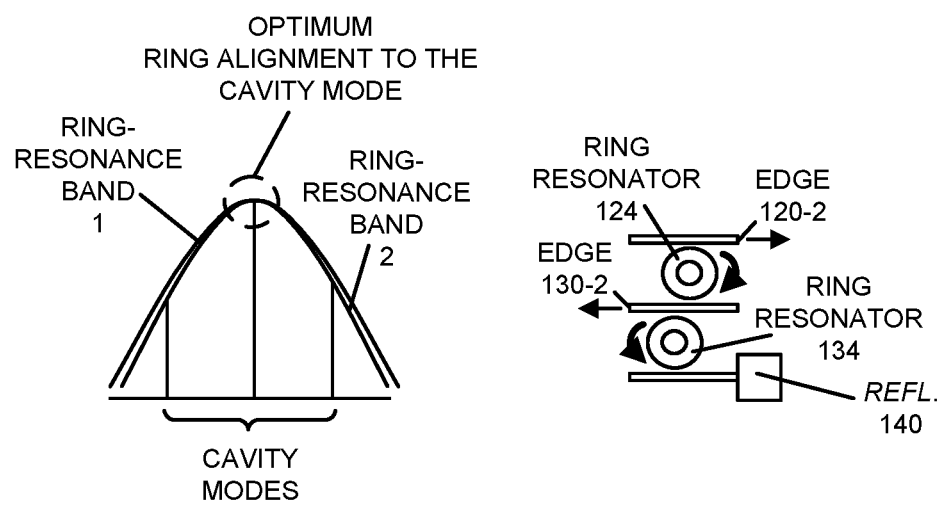
FIG. 9 is a drawing illustrating dual ring-resonator alignment during lasing in the hybrid external cavity laser of FIG. 1 in accordance with an embodiment of the present disclosure.

Moreover, as shown in FIG. 8, which presents a drawing illustrating dual ring-resonator alignment during lasing in hybrid external cavity laser 100 (FIG. 1), either or both of the ring resonators can walk-off from the main peak location due to external perturbations. In this case, the optical power at edge 130-2 may be increased because of the resonance-wavelength misalignment. Once again, control logic 148 (FIG. 1) can move the resonance wavelength of ring resonator 134 to minimize the optical power at edge 130-2. Moreover, once edge 130-2 has settled into the lowest power range, the two ring resonators may be back in line with the laser cavity mode, and the laser may be back to a stable condition. This is shown in FIG. 9, which presents a drawing illustrating dual ring-resonator alignment during lasing in hybrid external cavity laser 100 (FIG. 1).

The Vernier dual ring resonators may provide a wide wavelength tuning range. However, the tuning characteristics of each ring resonator may still need to be preconfigured and the two ring resonators may need to be precisely controlled in order to move the aligned ring-resonance wavelengths to a specific carrier wavelength. Therefore, a look-up table may be used to match the tuning power to the thermal-tuning mechanism(s) for desired laser wavelengths. This process is inefficient and sometimes unreliable because of possible ambient temperature change and the associated variation in the effective index of refraction. In order to address this issue, the wavelength-control technique that has been described can be used to tune over the entire wavelength-tuning range without having the spectral information of each ring resonator.

Figure 10:
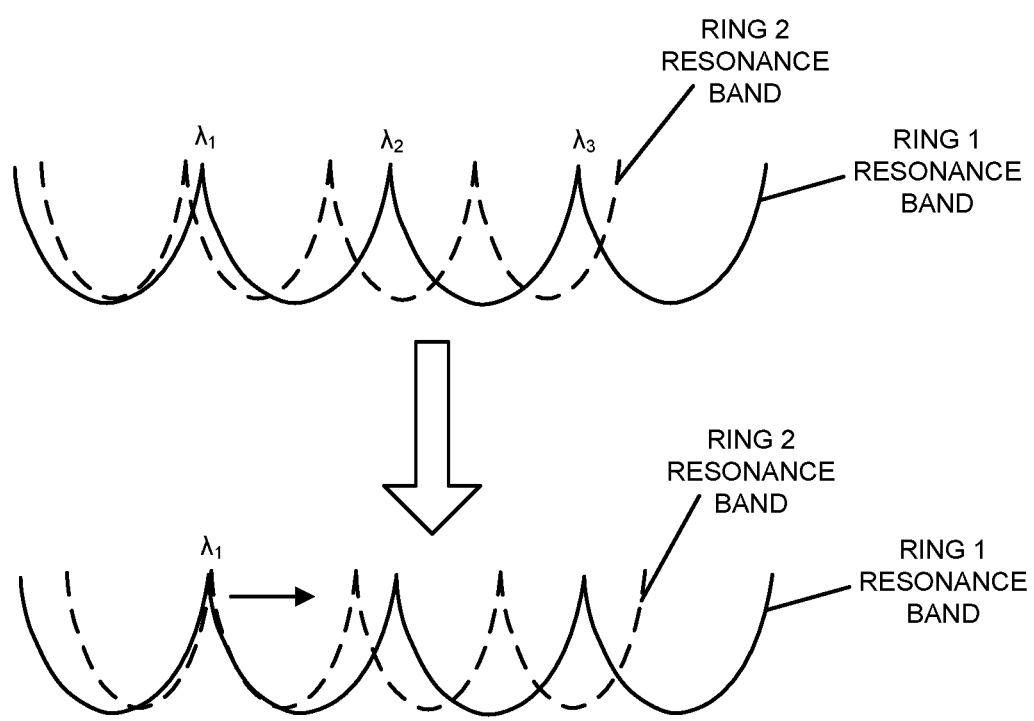
FIG. 10 is a drawing illustrating dual ring-resonator tuning in the hybrid external cavity laser of FIG. 1 in accordance with an embodiment of the present disclosure.

In particular, the start laser wavelength is first identified. This is shown in FIG. 10, which presents a drawing illustrating dual ring-resonator tuning in the hybrid external cavity laser 100 (FIG. 1). In particular, the top view in FIG. 10 shows an overlapped view of two ring-resonator resonances prior to tuning control. There are no perfectly aligned resonances at this point but the most closely neighbored bands are located near $\lambda_1$. By adjusting thermal tuning mechanism 144-2, the resonance of ring resonantor 134 near $\lambda_1$ can be aligned with the resonance of ring resonator 124 located at $\lambda_1$. This wavelength is set to be the start wavelength and can be identified by the laser-starting procedure described previously.

Next, the laser wavelength is tuned using a common thermal-tuning mechanism. In particular, once the laser is stabilized at this wavelength ($\lambda_1$), the common thermal-tuning mechanism can move the ring-resonance wavelengths simultaneously, which allows the laser-wavelength tuning. As shown in the bottom view in FIG. 10, a wavelength-tuning range from $\lambda_1$ to $\lambda_2$ can be achieved by one free-spectral-range shift of ring-resonance band 1. If the common tuning power can be increased further, the laser wavelength can be tuned across the entire expanded Vernier ring free-spectral range. However, this will increase the overall power consumption.

Figure 11:
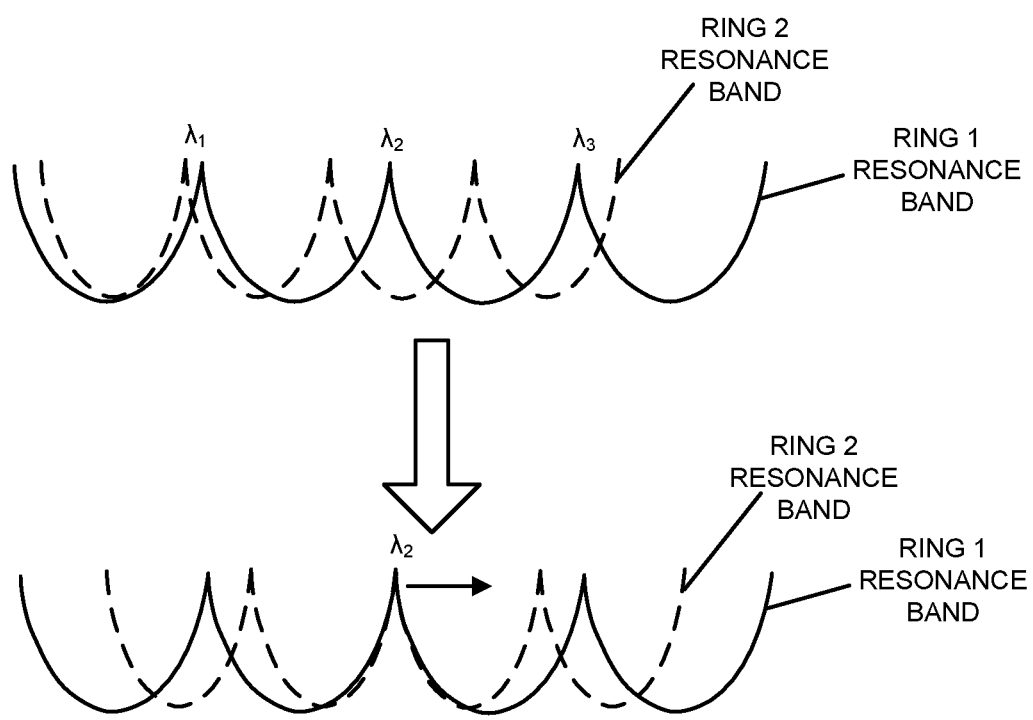
FIG. 11 is a drawing illustrating dual ring-resonator tuning in the hybrid external cavity laser of FIG. 1 in accordance with an embodiment of the present disclosure.

Moreover, the next start laser wavelength is identified. In the Vernier-ring alignment technique described previously, multiple tuning-power conditions that result in stable laser operation can be identified. In the tuning operations described previously for FIG. 10, $\lambda_1$ was identified as the first start wavelength using the feedback control loop. After finding this first ring alignment condition, the tuning power applied to a thermal-tuning mechanism, which is thermally coupled to one of the ring resonators (such as ring resonator 134 in FIG. 1), may be increased further to search for the next ring alignment condition. As shown in the top view in FIG. 11, which presents a drawing illustrating dual ring-resonator tuning in the hybrid external cavity laser 100 (FIG. 1), this may align the resonance wavelengths of the two ring resonators at $\lambda_2$. This would be the second start laser wavelength.

Now, the laser wavelength can be tuned using a common heater. In particular, once the laser is stabilized at this new start wavelength ($\lambda_2$), the common thermal-tuning mechanism can move the resonance wavelengths of the two ring resonators simultaneously, which allows laser-wavelength tuning (as shown in the bottom view in FIG. 11). Once again, a wavelength-tuning range from $\lambda_2$ to $\lambda_3$ can be achieved by one free-spectral-range shift of a ring resonator 124 (FIG. 1). The operations shown in FIG. 11 can be repeated in order to tune the laser wavelength across the entire Vernier-ring free-spectral range with multiple starting points.

Thus, the feedback-control technique may be used to control a Vernier-ring laser wavelength in a silicon/III-V semiconductor hybrid external cavity. Previously, Vernier-ring resonance control has been a challenge because it often requires spectral information for each ring resonator and a precise resonance shift. In the disclosed feedback-control technique, the Vernier-ring wavelength control can be achieved using optical power measurements and the feedback-control technique, without a need for optical spectrum analysis. Therefore, the feedback-control technique can enable a simple, fast and economical way to control the laser wavelength without an optical spectrum analyzing tool. This feedback-control technique can also simultaneously provide laser-mode stability and wavelength tuning, and can be implemented in the hybrid external cavity laser to provide a fully packaged on-chip laser.

Figure 12:
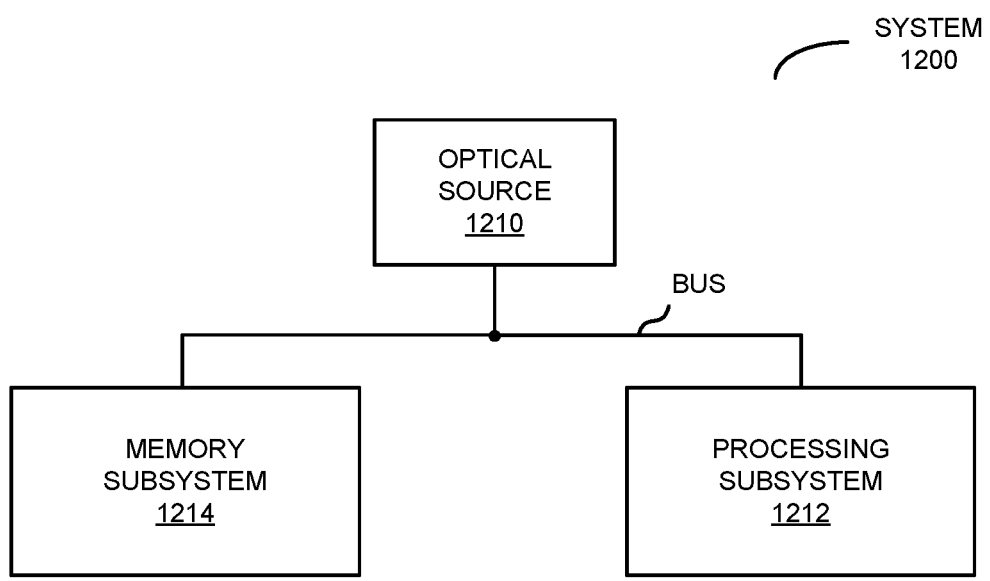
FIG. 12 is a block diagram illustrating a system that includes an optical source in accordance with an embodiment of the present disclosure.

One or more of the preceding embodiments of the optical source may be included in a system and/or an electronic device. This is shown in FIG. 12, which presents a block diagram illustrating a system 1200 that includes optical source 1210, such as one of the preceding embodiments of the optical source. In some embodiments, system 1200 includes processing subsystem 1212 (with one or more processors) and memory subsystem 1214 (with memory).

In general, functions of optical source 1210 and system 1200 may be implemented in hardware and/or in software. Thus, system 1200 may include one or more program modules or sets of instructions stored in a memory subsystem 1214 (such as DRAM or another type of volatile or non-volatile computer-readable memory), which, during operation, may be executed by a processing subsystem 1212. Note that the one or more computer programs may constitute a computer-program mechanism. Furthermore, instructions in the various modules in memory subsystem 1214 may be implemented in: a high-level procedural language, an object-oriented programming language, and/or in an assembly or machine language. Note that the programming language may be compiled or interpreted, e.g., configurable or configured, to be executed by the processing subsystem.

Components in system 1200 may be coupled by signal lines, links or buses. These connections may include electrical, optical, or electro-optical communication of signals and/or data. Furthermore, in the preceding embodiments, some components are shown directly connected to one another, while others are shown connected via intermediate components. In each instance, the method of interconnection, or 'coupling,' establishes some desired communication between two or more circuit nodes, or terminals. Such coupling may often be accomplished using a number of circuit configurations, as will be understood by those of skill in the art; for example, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 1200 may be at one location or may be distributed over multiple, geographically dispersed locations.

System 1200 may include: a VLSI circuit, a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, optical source 1210 can be used in a wide variety of applications, such as: communications (for example, in a transceiver, an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

Furthermore, the embodiments of optical source 1210 and/or system 1200 may include fewer components or additional components. For example, the semiconductor substrate may be one of multiple substrates in a multi-chip module (such as a multi-chip module in which alternating facing chips that include routing and bridge layers are coupled using optical proximity communication). Furthermore, a wide variety of fabrication techniques may be used to fabricate the optical source in the preceding embodiments of the optical source, as is known to one of skill in the art. For example, instead of flip-chip or wafer bonding, semiconductor optical amplifier 110 (FIG. 1) may be monolithically integrated onto a silicon-on-insulator substrate by epitaxial growth or using another fabrication technique. In addition, a wide variety of optical components may be used in or in conjunction with the optical source.

In some embodiments, instead of a thermal-tuning mechanism associated with the first ring resonator and a common thermal-tuning mechanism associated with the first ring resonator and the second ring resonator, the optical source may include: a thermal-tuning mechanism associated with the second ring resonator and the common thermal-tuning mechanism associated with the first ring resonator and the second ring resonator; the thermal-tuning mechanism associated with the first ring resonator and the thermal-tuning mechanism associated with the second ring resonator; or the thermal-tuning mechanism associated with the first ring resonator, the thermal-tuning mechanism associated with the second ring resonator, and the common thermal-tuning mechanism associated with the first ring resonator and the second ring resonator.

Although these embodiments are illustrated as having a number of discrete items, these optical components, integrated circuits and the system are intended to be functional descriptions of the various features that may be present rather than structural schematics of the embodiments described herein. Consequently, in these embodiments two or more components may be combined into a single component, and/or a position of one or more components may be changed. In addition, functionality in the preceding embodiments of the optical source, optical source 1210 and/or system 1200 may be implemented more in hardware and less in software, or less in hardware and more in software, as is known in the art.

While the preceding embodiments have been illustrated with particular elements and compounds, a wide variety of materials and compositions (including stoichiometric and non-stoichiometric compositions) may be used, as is known to one of skill in the art. Thus, while a silicon optical waveguide was illustrated in the preceding embodiments, the communication technique may be used with other materials (such as germanium and/or silicon germanium), as is known to one of skill in the art. Moreover, the semiconductor layer may include polysilicon or amorphous silicon. Furthermore, the materials and compounds in optical source 1210 may be fabricated using a wide variety of processing techniques, including: evaporation, sputtering, chemical vapor deposition, molecular-beam epitaxy, wet or dry etching (such as photolithography or direct-write lithography), polishing, etc. In addition, a wide variety of optical components may be used in or in conjunction with the optical device and/or optical source 1210.

Figure 13:
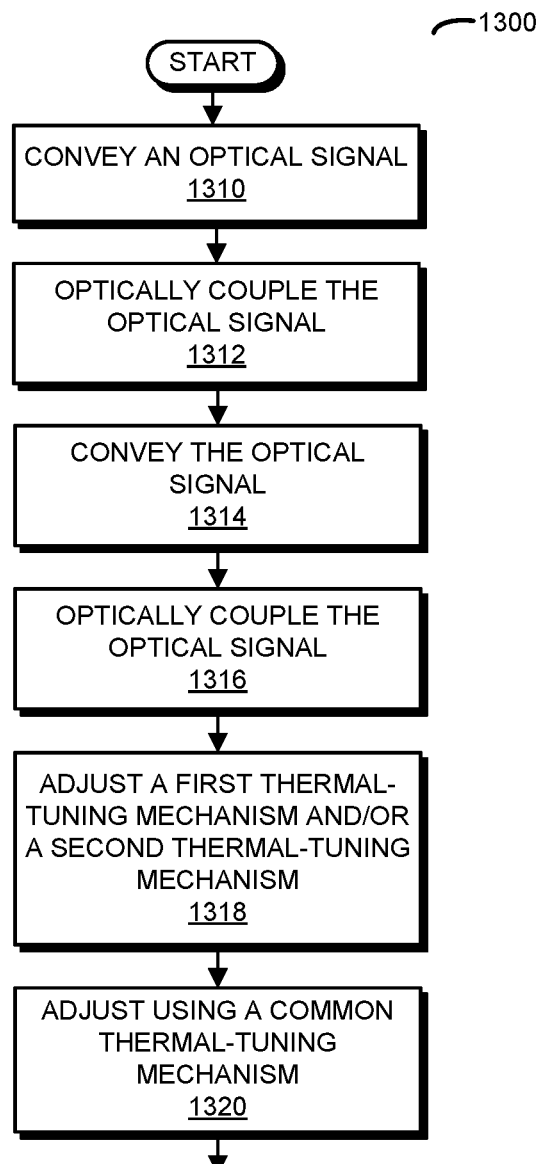
FIG. 13 is a flow chart illustrating a method for tuning an optical source that includes a first ring resonator and a second ring resonator that operate as Vernier rings in accordance with an embodiment of the present disclosure.

We now describe embodiments of a method for tuning an optical source. FIG. 13 presents a flow chart illustrating a method 1300 for tuning an optical source that includes a first ring resonator and a second ring resonator that operate as Vernier rings, which may be performed by an embodiment of the optical source. During operation, a first optical waveguide conveys an optical signal (operation 1310) from a semiconductor optical amplifier. Then, the optical signal is optically coupled (operation 1312) from the first optical waveguide to a second optical waveguide via the first ring resonator. Moreover, a second optical waveguide conveys the optical signal (operation 1314). Next, the optical signal is optically coupled (operation 1316) from the second optical waveguide to a third optical waveguide via a second ring resonator.

When the optical source is operated below a lasing threshold, a first thermal-tuning mechanism, which is thermally coupled to the first ring resonator, and/or a second thermal-tuning mechanism, which is thermally coupled to the second ring resonator, are adjusted (operation 1318) to align a first resonance of the first ring resonator and a second resonance of the second ring resonator based on a measured optical power at an edge of the second optical waveguide. Furthermore, when the optical source is operated above the lasing threshold, a common thermal-tuning mechanism locks (operation 1320) the aligned first and second resonances of the first ring resonator and the second ring resonator with an optical cavity mode of the optical source based on a measured optical power at an edge of the first optical waveguide.

In some embodiments of method 1300, there may be additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An optical source, comprising:
  a semiconductor optical amplifier defined in a semiconductor other than silicon, wherein the semiconductor optical amplifier has a first edge and a second edge, includes a reflective coating on the first edge, and, during operation, provides an optical signal at the second edge; and
  a photonic chip optically coupled to the semiconductor optical amplifier, wherein the photonic chip includes:
    a first optical waveguide having a third edge, optically coupled to the second edge of the semiconductor optical amplifier, and a fourth edge;
    a first ring resonator optically coupled to the first optical waveguide;
    a second optical waveguide, optically coupled to the first ring resonator, having a fifth edge and a sixth edge optically coupled to a first termination;
    a second ring resonator optically coupled to the second optical waveguide;
    a common thermal-tuning mechanism thermally coupled to the first ring resonator and the second ring resonator;
    a first thermal-tuning mechanism thermally coupled to the first ring resonator;
    a second thermal-tuning mechanism thermally coupled to the second ring resonator;
    a monitoring device optically coupled to the fourth edge and the fifth edge; and
    control logic, electrically coupled to the monitoring device, the common thermal-tuning mechanism, the first thermal-tuning mechanism and the second thermal-tuning mechanism, that, during operation, tunes the first ring resonator and the second ring resonator.

2. The optical source of claim 1, wherein the control logic tunes the first ring resonator and the second ring resonator by:
  adjusting, when the optical source is operated below a lasing threshold, at least one of the first thermal-tuning mechanism and the second thermal-tuning mechanism to align a first resonance of the first ring resonator and a second resonance of the second ring resonator based on a measured optical power at the fifth edge; and
  adjusting, when the optical source is operated above the lasing threshold, the common thermal-tuning mechanism to lock the aligned first and second resonances with an optical cavity mode of the optical source having a carrier wavelength based on a measured optical power at the fourth edge.

3. The optical source of claim 2, wherein, during operation, the control logic maintains the alignment of the first and second resonances with the optical cavity mode by:
  adjusting the common thermal-tuning mechanism to minimize the measured output power at the fourth edge; and
  adjusting at least one of the first thermal-tuning mechanism and the second thermal-tuning mechanism to minimize the measured output power at the fifth edge.

4. The optical source of claim 2, wherein the first and the second resonances are aligned by minimizing the measured optical power at the fifth edge.

5. The optical source of claim 2, wherein the first and the second resonances are aligned by minimizing the measured optical power at the fourth edge.

6. The optical source of claim 1, wherein the semiconductor optical amplifier is one of: edge coupled to the photonic chip; and surface-normal coupled to the photonic chip.

7. The optical source of claim 1, wherein a given thermal-tuning mechanism includes one of: a doped semiconductor heater; and a metal heater.

8. The optical source of claim 1, wherein the optical source further comprises a phase modulator optically coupled to the first optical waveguide.

9. The optical source of claim 1, wherein the photonic chip includes:
  a substrate;
  a buried-oxide layer disposed on the substrate; and
  a semiconductor layer disposed on the buried-oxide layer, wherein optical components are defined in the semiconductor layer.

10. The optical source of claim 9, wherein the substrate, the buried-oxide layer and the semiconductor layer constitute a silicon-on-insulator technology.

11. A system, comprising:
  a processor;
  a memory coupled to the processor; and
  an optical source, wherein the optical source includes:
    a semiconductor optical amplifier defined in a semiconductor other than silicon, wherein the semiconductor optical amplifier has a first edge and a second edge, includes a reflective coating on the first edge, and, during operation, provides an optical signal at the second edge; and a photonic chip optically coupled to the semiconductor optical amplifier, wherein the photonic chip includes:
- a first optical waveguide having a third edge, optically coupled to the second edge of the semiconductor optical amplifier, and a fourth edge;
- a first ring resonator optically coupled to the first optical waveguide;
- a second optical waveguide, optically coupled to the first ring resonator, having a fifth edge and a sixth edge optically coupled to a first termination;
- a second ring resonator optically coupled to the second optical waveguide;
- a common thermal-tuning mechanism thermally coupled to the first ring resonator and the second ring resonator;
- a first thermal-tuning mechanism thermally coupled to the first ring resonator;
- a second thermal-tuning mechanism thermally coupled to the second ring resonator;
- a monitoring device optically coupled to the fourth edge and the fifth edge; and
- control logic, electrically coupled to the monitoring device, the common thermal-tuning mechanism, the first thermal-tuning mechanism and the second thermal-tuning mechanism, that, during operation, tunes the first ring resonator and the second ring resonator.

12. The system of claim 11, wherein the control logic tunes the first ring resonator and the second ring resonator by:
- adjusting, when the optical source is operated below a lasing threshold, at least one of the first thermal-tuning mechanism and the second thermal-tuning mechanism to align a first resonance of the first ring resonator and a second resonance of the second ring resonator based on a measured optical power at the fifth edge; and
- adjusting, when the optical source is operated above the lasing threshold, the common thermal-tuning mechanism to lock the aligned first and second resonances with an optical cavity mode of the optical source having a carrier wavelength based on a measured optical power at the fourth edge.

13. The system of claim 12, wherein, during operation, the control logic maintains the alignment of the first and second resonances with the optical cavity mode by:
- adjusting the common thermal-tuning mechanism to minimize the measured output power at the fourth edge; and
- adjusting at least one of the first thermal-tuning mechanism and the second thermal-tuning mechanism to minimize the measured output power at the fifth edge.

14. The system of claim 13, wherein the first and second ring-resonances are aligned by minimizing the measured optical power at the fifth edge.

15. The system of claim 13, wherein the first and second ring-resonances are aligned by minimizing the measured optical power at the fourth edge.

16. The system of claim 11, wherein the optical source further comprises a phase modulator optically coupled to the first optical waveguide.

17. The system of claim 11, wherein a given thermal-tuning mechanism includes one of: a doped semiconductor heater; and a metal heater.

18. The system of claim 11, wherein the photonic chip includes:
- a substrate;
- a buried-oxide layer disposed on the substrate; and
- a semiconductor layer disposed on the buried-oxide layer, wherein optical components are defined in the semiconductor layer.

19. The system of claim 18, wherein the substrate, the buried-oxide layer and the semiconductor layer constitute a silicon-on-insulator technology.

20. A method for tuning an optical source that includes a first ring resonator and a second ring resonator that operate as Vernier rings, the method comprising:
- conveying an optical signal from a semiconductor optical amplifier in a first optical waveguide;
- optically coupling the optical signal from the first optical waveguide to a second optical waveguide via the first ring resonator;
- conveying the optical signal in the second optical waveguide;
- optically coupling the optical signal from the second optical waveguide to a third optical waveguide via a second ring resonator;
- adjusting, when the optical source is operated below a lasing threshold, one of a first thermal-tuning mechanism, which is thermally coupled to the first ring resonator, and a second thermal-tuning mechanism, which is thermally coupled to the second ring resonator, to align a first resonance of the first ring resonator and a second resonance of the second ring resonator based on a measured optical power at an edge of the second optical waveguide; and
- adjusting, when the optical source is operated above the lasing threshold, a common thermal-tuning mechanism to lock the aligned first and second resonances with an optical cavity mode of the optical source having a carrier wavelength based on a measured optical power at an edge of the first optical waveguide.

* * * * *

UNITED STATES PATENT AND TRADEMARK OFFICE
CERTIFICATE OF CORRECTION

PATENT NO. : 9,608,406 B1
APPLICATION NO. : 15/004569
DATED : March 28, 2017
INVENTOR(S) : Lee et al.

Page 1 of 1

It is certified that error appears in the above-identified patent and that said Letters Patent is hereby corrected as shown below:

In the Specification

In Column 1, Line 24, after "a" insert -- III-V --.

In Column 5, Line 19, after "a" insert -- III-V --.

In Column 6, Line 59, after "1.1-1.7" insert -- μm. --.

In Column 6, Line 61, after "1.55" insert -- μm. --.

In Column 6, Line 64, after "0.3" insert -- μm. --.

In Column 9, Line 55, delete "resonantor" and insert -- resonator --, therefor.

Signed and Sealed this
Nineteenth Day of September, 2017

Joseph Matal
*Performing the Functions and Duties of the*
*Under Secretary of Commerce for Intellectual Property and*
*Director of the United States Patent and Trademark Office*